US009010951B2

(12) United States Patent
Lee

(10) Patent No.: US 9,010,951 B2
(45) Date of Patent: Apr. 21, 2015

(54) OPTICAL LENS, LIGHT EMITTING DEVICE, AND DISPLAY

(71) Applicant: LG Innotek Co., Ltd., Seoul (KR)

(72) Inventor: Chang Hyuck Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/274,934

(22) Filed: May 12, 2014

(65) Prior Publication Data

US 2015/0009452 A1 Jan. 8, 2015

(30) Foreign Application Priority Data

Jul. 5, 2013 (KR) .................. 10-2013-0079162
Jul. 15, 2013 (KR) .................. 10-2013-0082795

(51) Int. Cl.

| G09F 13/04 | (2006.01) |
|---|---|
| G09F 13/08 | (2006.01) |
| F21V 5/04 | (2006.01) |
| G02F 1/1335 | (2006.01) |

(52) U.S. Cl.
CPC ............ F21V 5/04 (2013.01); G02F 1/133504 (2013.01)

(58) Field of Classification Search
CPC ..... F21V 5/04; F21V 5/046; G02F 1/133504; G02F 1/133602; G02F 1/133603; G02F 1/133606; G02F 2001/133607
USPC ............................... 362/97.1–97.4
See application file for complete search history.

(56) References Cited

U.S. PATENT DOCUMENTS

| 7,602,559 B2 | 10/2009 | Jang et al. |
| 7,738,189 B2 | 6/2010 | Park et al. |
| 8,508,689 B2 | 8/2013 | Kuwaharada et al. |
| 8,622,594 B2 | 1/2014 | Ishio et al. |
| 8,641,238 B2 | 2/2014 | Chiu et al. |
| 2006/0238884 A1 | 10/2006 | Jang et al. ...................... 359/653 |
| 2008/0151551 A1 | 6/2008 | Yang et al. ..................... 362/308 |

(Continued)

FOREIGN PATENT DOCUMENTS

| DE | 10 2005 019 832 A1 | 9/2006 |
| EP | 1 376 708 | 11/2011 |

(Continued)

OTHER PUBLICATIONS

Korean Office Action dated Oct. 16, 2014, issued in Application No. 10-2013-0079162.

(Continued)

*Primary Examiner* — Jason Moon Han
(74) *Attorney, Agent, or Firm* — KED & Associates, LLP

(57) ABSTRACT

An optical lens, light emitting device, and display are provided. The optical lens may include a flange comprising an upper surface and a bottom surface, a protruder that protrudes with respect to the bottom surface, a first surface that extends from the upper surface of the flange, and a second surface inwardly recessed toward the protruder. The first surface and the second surface may meet to form an outer rim of the optical lens. The first surface may be sloped with respect to an optical axis, which is a straight line that passes through a center of the protruder and a center of the second surface. A ratio of a longest straight-line distance between outermost edges of the flange taken across the flange to a shortest straight-line distance from a lowermost point of the protruder to a plane including the outer rim may be approximately 0.5 to 5.

30 Claims, 13 Drawing Sheets

(56) References Cited

U.S. PATENT DOCUMENTS

| | | | |
|---|---|---|---|
| 2011/0044053 A1 | 2/2011 | Yamaguchi | 362/296.05 |
| 2011/0205744 A1 | 8/2011 | Kim | 362/296.01 |
| 2013/0088857 A1 | 4/2013 | Lee et al. | 359/97.1 |

FOREIGN PATENT DOCUMENTS

| | | |
|---|---|---|
| JP | 2004-349251 | 12/2004 |
| JP | 2006-093148 | 4/2006 |
| JP | 2006-093470 | 4/2006 |
| JP | 2007-139937 | 6/2007 |
| JP | 2008-186742 | 8/2008 |
| JP | 2010-152282 A | 7/2010 |
| JP | 2011-044610 A | 3/2011 |
| JP | 2011-095759 | 5/2011 |
| JP | 5150047 | 12/2012 |
| JP | 2013-12417 A | 1/2013 |
| JP | 2013-012632 A | 1/2013 |
| KR | 10-2006-0034021 A | 4/2006 |
| KR | 10-2006-0112113 A | 10/2006 |
| KR | 10-0713582 | 4/2007 |
| KR | 10-2011-0138966 | 12/2011 |
| KR | 10-2013-0003853 | 1/2013 |
| KR | 10-1287023 | 7/2013 |
| WO | WO 2008/007492 A1 | 1/2008 |
| WO | WO 2012/004975 A1 | 1/2012 |
| WO | WO 2013/081417 | 6/2013 |

OTHER PUBLICATIONS

European Search Report dated Oct. 28, 2014, issued in Application No. 14173733.

Korean Office Action dated Jun. 18, 2014, issued in Application No. 10-2013-0079162.

Korean Office Action dated Jun. 20, 2014 issued in Application Serial No. 10-2013-0033374.

European Search Report dated Jul. 1, 2014 issued in Application Serial No. 14162193.8.

Korean Office Action dated Jul. 11, 2014, issued in Application No. 10-2013-0082795.

US 8,567,998, 10/2013, Yoon et al. (withdrawn).

OPTICAL LENS, LIGHT EMITTING DEVICE, AND DISPLAY

CROSS-REFERENCE TO RELATED APPLICATIONS(S)

This application claims priority under 35 U.S.C. §119 to Korean Application No. 10-2013-0079162, filed in Korea on Jun. 24, 2013 and Korean Application No. 10-2013-0082795, filed in Korea on Jul. 15, 2013, whose entire disclosures are hereby incorporated by reference.

BACKGROUND

1. Field

An optical lens, light emitting device, and display are disclosed herein.

2. Background

In general, a liquid crystal display (LCD) is a device to convert and transfer various kinds of electric information generated from various devices into visual information using a change in liquid crystal transmittance according to applied voltage. The liquid crystal display needs a halo because it has no magneto-luminescence, but has been widely used because it is low in power consumption, lightweight, and can be constructed of a flat panel type.

The liquid crystal display may include a backlight unit (BLU), which is a light emitting device that provides light to a rear surface of a liquid crystal panel on which an image is displayed because it has no magneto-luminescence. Further, the liquid crystal display may include a color filter substrate and an array substrate, which may be spaced apart from each other at a predetermined interval and opposed to each other, a liquid crystal panel having a liquid crystal layer interposed between the color filter substrate and the array substrate, a backlight unit or backlight to irradiate light to the liquid crystal panel, and other components.

The backlight unit used in the liquid crystal display may be divided into an edge type and a direct type according to positions of light emitting diodes which are light sources. In the case of the edge-type backlight unit, the light emitting diodes are arranged on a side of a light guide plate, and the light guide plate irradiates light, which is irradiated from the light emitting diodes, toward the liquid crystal panel through total reflection.

The direct-type backlight unit uses a diffusion plate instead of the light guide plate. In the case of the direct-type backlight unit, the light emitting diodes are arranged at a rear side of the liquid crystal panel, and thus, irradiate light toward the rear side of the liquid crystal panel.

Uniformity of brightness is an important element to determine quality of the liquid crystal display, and thus, the backlight unit must uniformly irradiate light toward the liquid crystal panel.

BRIEF DESCRIPTION OF THE DRAWINGS

Embodiments will be described in detail with reference to the following drawings in which like reference numerals refer to like elements, and wherein.

DETAILED DESCRIPTION OF THE PREFERRED EMBODIMENT

Figure 1:
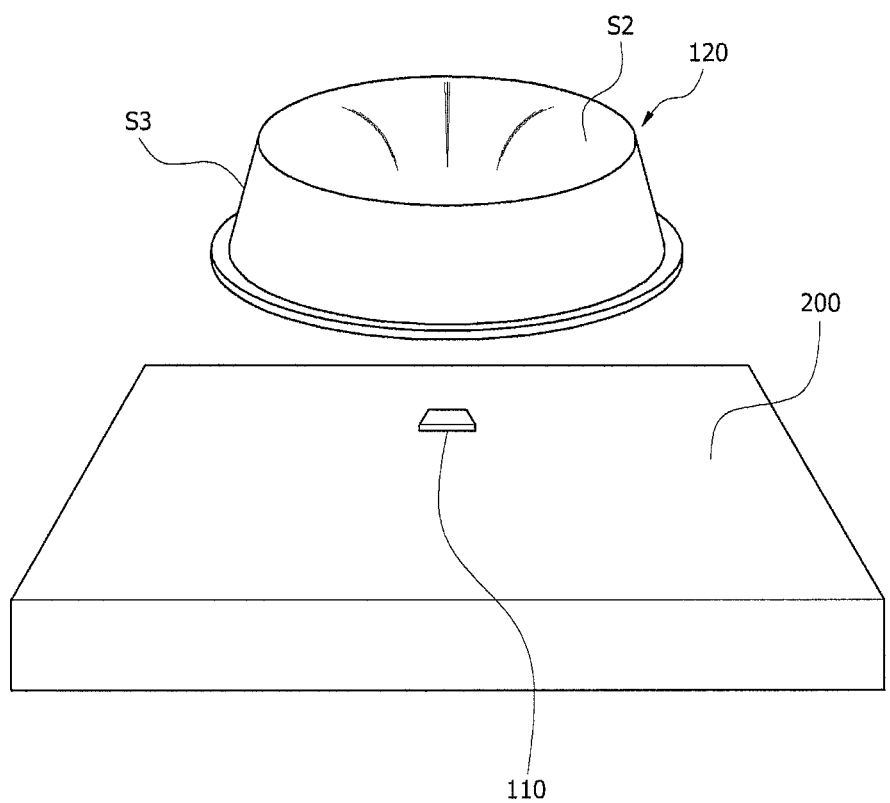
FIG. 1 is an exploded perspective view of a light emitting device according to an embodiment.

Embodiments will be described with reference to the accompanying drawings. Where possible, like reference numerals have been used to indicate like elements, and repetitive disclosure has been omitted.

It will be understood by those of ordinary skill in the art that various changes, modifications, and alternations may be made to the various embodiments disclosed herein, and the embodiments will be described with reference to the particular illustrative examples. However, it will be also understood that the embodiments is not limited to the particular embodiments and that all changes, equivalences and alterations without departing from the technical idea and the technical scope.

Terms having ordinal numbers, such as the first, the second, and so on may be used to describe various components, but the components are not restricted to the terms. The terms are used only for the purpose of distinguishing one component from other components. For instance, the second component may be named as the first component without departing from the technical scope, and in the same way, the first component may be named as the second component. The term, "and/or", means combination of a plurality of related items or one of a plurality of the related items.

Moreover, the terms, "module" and "part", which are suffixes of components used in the following description are used just for easiness in writing the specification and do not have any distinguishing meanings or roles.

If it is mentioned that a component is "connected" or "linked" to another component, it should be understood that a component may be directly connected or linked to another component, but a further component may exist between the former component and the latter component. On the other hand, if it is mentioned that a component is "directly connected" or "directly linked" to another component, it should be understood that there is no a further component between the former component and the latter component.

Terms used in this specification are used for describing particular embodiments and do not limit the embodiments. Expressions in singular form contain expressions in plural form unless otherwise specifically contextually stated. It should be understood that terms, "include" or "have", in this specification are just used to inform that there are characteristics, numbers, steps, operations, components or parts, or combinations of them described in this specification and do not exclude one or more other characteristics, numbers, steps, operations, components or parts, or one or more combinations of them, or additional possibility.

Unless otherwise specifically defined, all terms used in this specification including technical or scientific terms have the same meanings as those generally understood by those of ordinary skill in the art. Terms defined in the dictionary generally used must be interpreted to have the same meanings as the contextual meanings of relevant technologies, and unless otherwise clearly defined in this specification, they are not interpreted as ideal or excessively formal meanings.

Hereinafter, embodiments will be described with reference to the accompanying drawings where possible, like reference numerals have been used to indicate like elements, and repetitive disclosure has been omitted.

Referring to FIGS. 1 to 7, a luminous flux controlling member or optical lens, a light emitting device including the optical device, and a display according to an embodiment will be described in detail. In this embodiment, the optical lens may include two surfaces that form external surfaces and function as reflective surfaces in order to enhance uniformity of brightness.

Figure 2:
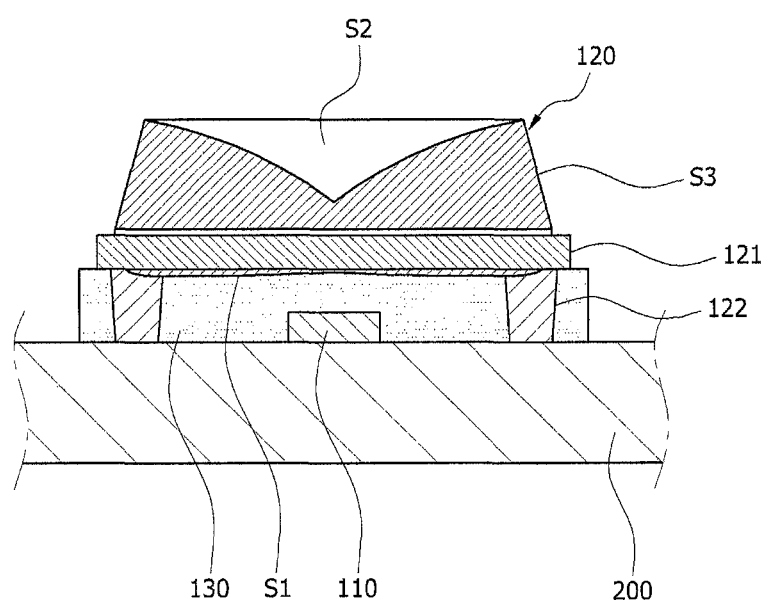
FIG. 2 is a cross-sectional view of the light emitting device of FIG. 1.
Figure 3:
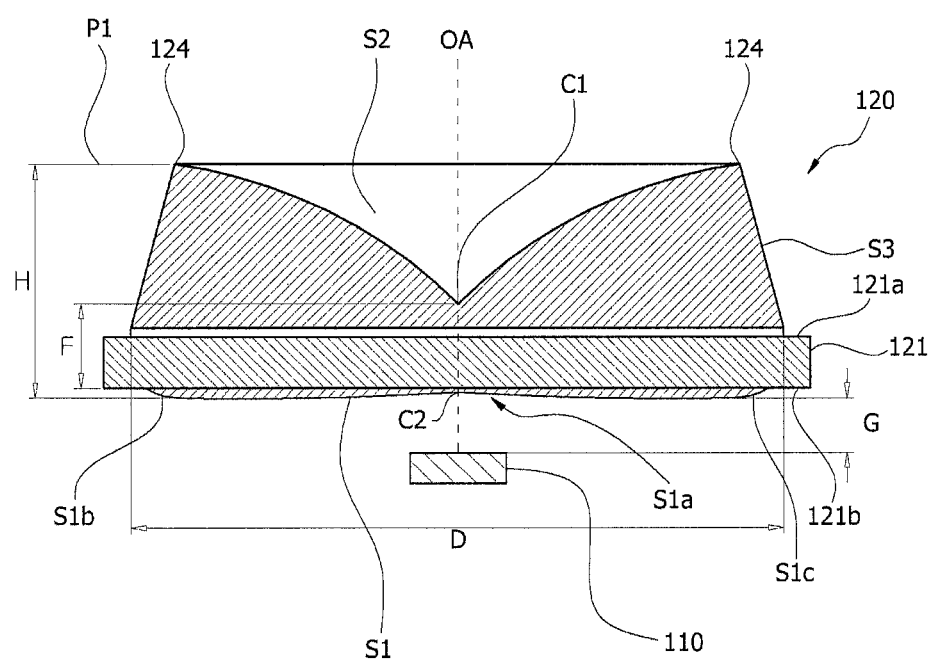
FIG. 3 is a cross-sectional view of an optical lens of the light emitting device of FIG. 1.

FIG. 1 is an exploded perspective view of a light emitting device according to an embodiment. FIG. 2 is a cross-sectional view of the light emitting device of FIG. 1. FIG. 3 is a cross-sectional view of an optical lens of the light emitting device of FIG. 1. FIGS. 4A-4D are views showing that a curve section of the optical lens of FIG. 3 is defined by the Bezier curve equation. FIG. 5 is a view showing a light route inside the optical lens of FIG. 3.

Referring to FIGS. 1 and 2, the light emitting device may include a light emitter 110, an optical lens 120, and a drive substrate 200. The light emitter 110 may be arranged on the drive substrate 200, and may be electrically connected to a circuit pattern formed on the drive substrate 200. The light emitter 110 may receive an electric signal from the circuit pattern of the drive substrate 200, and function as a light source to convert the electric signal into an optical signal and output the optical signal. The light emitter 110 may be a light emitting diode (LED) that operates as a point light source, for example.

The optical lens 120 may control a light path by refracting incident light from the light emitter 110, so as to enhance uniformity of brightness of the light emitting device. The optical lens 120 may be arranged to cover at least a portion of an external surface of the light emitter 110. As shown in FIG. 2, the optical lens 120 may be separated from the light emitter 110. In this case, exit light from the light emitter 110 may be incident to the optical lens 120 through a side opposed to the light emitter 110. That is, a protruder S1 may be formed on an external surface of the optical lens 120.

The optical lens 120 may be, for example, an IOL (Integrated Optical Lens) type for which at least a portion of the light emitter 110 may be accommodated in the optical lens 120, namely, a type integrated to the light emitter. That is, exit light from the light emitter 110 may be incident to the optical lens 120 through an interface of the optical lens 120 in contact with an external surface of the light emitter 110. The interface of the optical lens 120 may become an incident surface to which light is incident from the light emitter 110.

The optical lens 120 may include a flange 121, and a plurality of supports 122 formed on the flange 121 to support the optical lens 120 on the drive substrate 200; however, embodiments are not limited thereto. That is, the optical lens 120 may be configured without the flange or the support.

FIG. 1 shows one light emitter 110 and one optical lens 120 arranged on one drive substrate 200; however, embodiments are not limited thereto. For example, a plurality of the light emitters 110 may be arranged on one drive substrate 200. Additionally, a plurality of the optical devices 120 may be arranged in correspondence with one light emitter 110.

Hereinafter, referring to FIG. 3, a shape of the optical lens according to this embodiment will be described in detail.

FIG. 3 is a cross-sectional view of the optical lens of FIGS. 1-2, taken in a Y-axis direction. Herein, cutting in an X-axis direction may mean that the optical lens 120 is cut perpendicularly to an optical axis OA, and the cutting in the Y-axis direction may mean that the optical lens 120 is cut in an axial direction of the optical axis OA.

The optical lens 120 may include a flange 121 having an upper surface 121a and a bottom surface 121b; a protruder S1 that protrudes with respect to the bottom surface of the flange 121 in order to receive light incident from light emitter 110; a first surface S2 inwardly recessed toward the protruder S1; and a second surface S3 that extends from the upper surface 121a of the flange 121. The optical lens 120 may be formed as one solid body.

Referring to FIG. 3, the optical lens 120 may satisfy a ratio (D/H) of width (D) to height (H), '0.5≤D/H≤5.0'. For example, the ratio (D/H) of width (D) to height (H) of the optical lens 120 may be approximately 2.5.

The width (D) of the optical lens 120 may be a maximum width of all parts of the optical lens 120 except for the flange 121. Moreover, the width (D) of the optical lens 120 may be a longest straight-line distance between outermost edges of the flange 121 taken across the flange 121.

The height (H) of the optical lens 120 may be a distance from a lowest (protruding) portion of the protruder S1 to a plane P1 including an outer rim 124 where the first surface S2 and the second surface S3 meet.

When the ratio (D/H) of width (D) to height (H) satisfies 0.5≤D/H≤5.0, out of light incident to the optical lens 120 from the light source 110, embodiments may control in such a manner that a first incident light, which has an incident angle smaller than a first angle is incident to the first surface S2, and a second incident light, which has an incident angle larger than a second angle, is incident to the second surface S3. Further, light which has an incident angle larger than the first angle, but smaller than the second angle, may advance toward one of the first surface S2 or the second surface S3. In this instance, the incident angle may be an angle formed between an advance path of light and the optical axis OA. Thereafter, the first incident light may be reflected in a direction of the second surface S3 by the first surface S2, and the second incident light may be reflected in a direction of the first surface S2 by the second surface S3.

For example, the first angle may be approximately 5 degrees to 20 degrees, and the second angle may be approximately 50 degrees to 70 degrees. For example, the first angle may be approximately 10 degrees and the second angle may be approximately 60 degrees.

If the ratio (D/H) of width (D) to height (H) is smaller than approximately 0.5 or larger than approximately 5.0, because the height (H) is relatively increased or decreased more than the width (D), uniformity of brightness may be deteriorated. That is, a quantity of light which is changed in advance path by being reflected to the second surface S3 and the first surface S2 may be reduced, and hence, it demonstrates a luminance distribution similar to a case where no lens is provided.

A ratio (H:F) of the height (H) of the optical lens 120 and a distance (F) between a center C1 of the first surface S2 and a center C2 of the protruder S1 may be approximately 1:00 or 1:1.5. Namely, the center C1 of the first surface S2 and the center C2 of the protruder S1 may meet together or may be spaced apart from each other at a predetermined interval.

The protruder S1 may be formed in a spherical shape or an aspherical shape.

The protruder S1 may have a cross-section taken in the X-axis direction or in the Y-axis direction, which includes a straight-line section. The protruder S1 may have a cross-section taken in the X-axis direction or in the Y-axis direction, which includes a curved line section.

In the case that the light emitter 110 is located outside of the optical lens 120, the protruder S1 may be formed on the bottom surface of the optical lens 120, which is opposed to the light emitter 110.

If the optical lens 120 is the IOL type which contains the light emitter therein, the protruder S1 of the optical lens 120 may be the internal surface which corresponds to the interface between the optical lens 120 and the light emitter.

The protruder S1 may be defined as a surface to which light discharged from the light emitter 110 is incident, and may contain a center hollowed toward the first surface S2. A ratio between the width (D) of the optical lens 120 and the center C2 of the protruder S1 may be in the range of approximately 1:0.01 to 1:0.15.

If the ratio between the width (D) of the optical lens 120 and a depth of the lowered center C2 of the protruder S1 satisfies the above-mentioned condition, it can solve the problem to control light in a vicinity of the outer rim 124 by reducing density of light incident to the center of the first surface S2. Moreover, it is possible to design a lens which has an efficiency optimized to light output distribution of various light sources.

The protruder S1 may include at least one hollow portion S1a sunken or concave toward an upper portion of the optical lens 120. A portion or the entire of the light emitter 110 may be accommodated in the hollow portion S1a formed in a lower surface of the optical lens 120. Further, exit light from the light emitter 110 may be incident to the optical lens 120 through an internal surface of the hollow portion S1a.

The protruder S1 may include at least one convex portion S1b, S1c that protrudes toward the light emitter 110. The protruder S1 may have a rotationally symmetric structure based on the optical axis OA. In addition, the protruder S1 may have a rotationally asymmetric structure relative to the optical axis OA.

The optical axis OA may be defined as a virtual straight line that indicates a passage direction of light from a center of a three-dimensionally luminous flux of light emitting from the point light source. The optical axis OA may coincide with a virtual axis that extends to pass through centers of the protruder S1, and the first surface S2.

The first surface S2 may be located at a central area of an upper portion of the optical lens 120 and at a position corresponding to the light emitter 110. The center of the first surface S2 may be located on the optical axis OA.

The first surface S2 may extend in a direction away from the optical axis OA. The first surface S2 may have a rotationally symmetric structure relative to the optical axis OA. Moreover, the first surface S2 may have a rotationally asymmetric structure relative to the optical axis OA.

The first surface S2 may be a spherical surface or an aspherical surface. The first surface S2 may have a cross-section taken in the X-axis direction or in the Y-axis direction, which includes a straight line section. For example, the first surface S2 may be formed in a conical shape, which has a cross section of a straight line taken in the Y-axis direction.

The first surface S2 may have a cross section taken in the X-axis direction or in the Y-axis direction, which includes a curved line section. A vertex of the first surface S2 may be located on the optical axis OA, and face the light emitter 110.

The second surface S3 may be bent or curved from the outer rim 124. The second surface S3 may extend downwardly from the first surface S2 and may form an exterior surface of the optical lens 120.

The second surface S3 may have a rotationally symmetric structure relative to the optical axis OA. Moreover, the second surface S3 may have a rotationally asymmetric structure relative to the optical axis OA.

Herein, the term bending may mean a rapidly bent shape. For example, when two surfaces are bent while forming a curved surface with a radius of curvature of less than 0.1 mm, it may be interpreted that the two surfaces are curved. Moreover, the term curve may mean a gently bent shape. For example, when two surfaces are bent while forming a curved surface with a radius of curvature of more than 0.1 mm, it may be interpreted that the two surfaces are curved. Further, the term variation may mean that an aspect that the curved surface is changed is changed. For example, when the convex curve is changed into a concave curve, it may be interpreted that the convex curve and the concave curve are varied.

The second surface S3 may be a spherical surface or an aspherical surface. The second surface S3 may have a cross-section taken in the X-axis direction or in the Y-axis direction, which includes a straight line section. The second surface S3 may have a cross-section taken in the X-axis direction or in the Y-axis direction, which includes a curved line section.

A central area of the second surface S3 may have a concave shape sunken or concave toward an inside of the optical lens 120, or may have a convex shape that protrudes toward the outside of the optical lens 120.

The cross-section of the second surface S3 may be defined as a straight line or a curved line extends farther away from the optical axis OA toward an upper portion thereof. Moreover, the cross-section of the second surface S3 may be defined as a straight line or a curved line that gets closer to the optical axis OA toward the upper portion thereof.

When the cross-section of the protruder S1, the first surface S2, or the second surface S3 includes a curved line, the curved line may satisfy the spline curve which is nonlinearly numerical analysis. That is, the spline curve is a function to make a smooth curve using fewer control points and is defined by an interpolation curve passing through selected control points and an approximation curve, which is a line to connect the selected control points. For the spline curve, there are a B-spline curve, a Bezier curve, a non-uniform rational B-spline (NURBS) curve, a cubic spline curve, and others.

For example, the curved line contained in the cross-section of each surface may be indicated through the Bezier curve equation. The Bezier curve equation is an equation to obtain various free curves by movement of a start point of the initial control points, an end point which is the final control point, and an interior control point located between the start point and the end point, and may be indicated by the following formula 1.

$$B(u) = \sum_{k=0}^{N} P_k \frac{N!}{k!(N-k)!} u^k (1-u)^{N-k} \qquad \text{[Formula 1]}$$

In the above formula 1, B(u) is a continuous function obtained by the N control points which are located at different positions, N is a variable to determine the degree of Bezier curve function, Pk means a coordinate of the $k^{th}$ control point, and the Bezier curve has N+1 control points. Moreover, u is the real number ranging from 0 to 1 and indicates a curved line section that the control points are subdivided in the range of 0 to 1. In the Bezier curve equation (B(u)), $$\frac{N!}{k!(N-k)!}u^k(1-u)^{N-k}$$

is a blending function to create a curved line by blending the control points. Bezier curve may be changed in curved form according to positions of the control points.

The cross-section of the protruder S1 may be defined by the Bezier curve equation of 1≤N≤4. When N is 2 in relation to the protruder S1, the second Bezier curve equation (B(u)) in relation with the protruder S1 may be indicated by the following formula 2.

$$B(u)=(1-u)^2P_0+2u(1-u)P_1+u^2P_2 \quad \text{[Formula 2]}$$

In the formula 2, when the coordinate values of the start point P0 and the end point P2 of the curved line are respectively defined by (0,0) and (XE1, ZE1), the coordinate of the remaining control point P1 is (a11×XE1, b11×ZE1). Therefore, the position of the control point P1 is controlled by controlling the coefficients a11 and b11, and the curved form of the cross-section of the protruder S1 may be controlled by controlling the position of the control point P1.

The parameters XE1, ZE1, a11 and b11 for determining the curved form of the cross-section of the protruder S1 may be defined as shown in the following Table 1. Table 1 indicates coefficients in the Bezier curve for defining the curvature of the cross-section of the optical lens 120 cut in the X-axis direction.

TABLE 1

| Coefficients for setting control points in Bezier curve | | | | | |
|---|---|---|---|---|---|
| Coefficient | Min | Max | Coefficient | Min | Max |
| $a_{11}$ | 0 | 1.2 | $b_{11}$ | −5 | 5 |
| $a_{21}$ | −0.1 | 0.6 | $b_{21}$ | 0.1 | 0.8 |
| $a_{22}$ | 0.4 | 1.1 | $b_{22}$ | 0.2 | 1.4 |
| $a_{23}$ | 0 | 1 | $b_{23}$ | 0 | 1.2 |
| $XE_1$ | −1 | 1 | $ZE_1$ | 2 | 7 |
| $XE_2$ | 3 | 12 | $ZE_2$ | 2 | 12 |
| $XE_3$ | −2 | 2 | $ZE_3$ | −12 | 0 |

Referring to Table 1, the curved line of the cross-section of the protruder S1 is set in such a manner that the X coordinate (XE1) and the Z coordinate (ZE1) of the end point P2 and the coefficients a11 and b11 for determining the coordinate of the remaining control point P1, respectively, satisfy −1≤XE1≤1, 2≤ZE1≤7, 0≤a11≤1.2, and −5≤b11≤15.

Figure 4A:
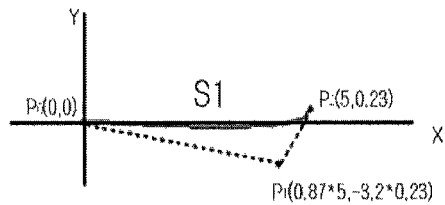
FIGS. 4A-4D are views showing that a curve section of the optical lens of FIG. 3 is defined by the Bezier curve equation.
Figure 5:
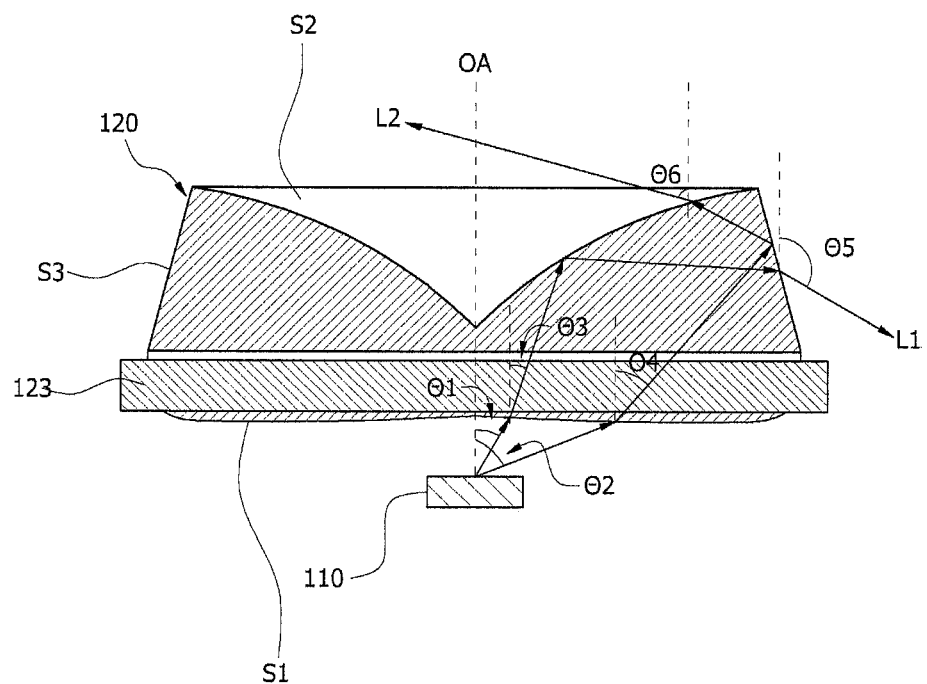
FIG. 5 is a view showing a light route inside the optical lens of FIG. 3.

FIG. 4A illustrates the curved form of the cross-section of the protruder S1 may be defined by the Bezier curve equation. In FIG. 4A, the curved line of the cross-section of the protruder S1 may start at P0(0,0) and end at P2(5,0.23), the coefficients a11 and b11 of the Bezier curve equation for defining the curved line may be, respectively, 0.87 and −3.2, and a position of the remaining control point P1 may be defined by the second Bezier curve of (0.87×5, −3.2×0.23).

The cross-section of the first surface S2 may be defined by Bezier curve of 1≤N≤6. When N is 3 in relation with the first surface S2, the third Bezier curve equation in relation with the first surface S2 may be indicated by the following formula 3.

$$B(u)=(1-u)^3P_0+3u(1-u)^2P_1+3u^2(1-u)P_2+u^3P_3 \quad \text{[Formula 3]}$$

In the formula 3, when the coordinate values of the start point P0 and the end point P3 of the curved line are, respectively, defined by (0,0) and (XE12, ZE2), the coordinates of the remaining control points P1 and P2 may be (a21×XE2, b21×ZE2) and (a22×XE22, b22×ZE2). Therefore, the positions of the control points P1 and P2 may be controlled by controlling the coefficients a21, a22, b21 and b22, and the curved form of the cross-section of the first surface S2 may be controlled by controlling the positions of the control points P1 and P2.

Here, the parameters XE2, ZE2, a21, b21, a22 and b22 for determining the curved form may be defined as shown in the following Table 1.

Referring to Table 1, the curved line of the cross-section of the first surface S2 may be set in such a manner that the X coordinate (XE2) and the Z coordinate (ZE2) of the end point P3 and the coefficients a21, a22, b21 and b22 for determining the coordinates of the remaining control points P1 and P2, respectively, satisfy 3≤XE2≤12, 2≤ZE2≤12, −0.1≤a21≤0.6, 0.4≤a22≤1.1, 0.1≤b21≤0.8, 0.2≤b22≤1.4.

Figure 4B:
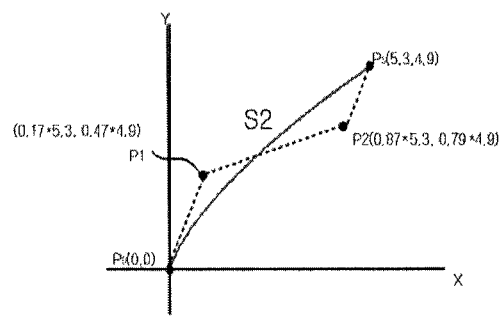

FIG. 4B illustrates the curved form of the cross-section of the first surface S2 defined by the Bezier curve equation. In FIG. 4B, the cross-section of the first surface S2 may start at P0(0,0) and end at P3(5.3,4.9), the coefficients a21, b21, a22 and b22 of the Bezier curve equation for defining the curved line may be, respectively, 0.17, 0.47, 0.87 and 0.79, and the positions of the remaining control points P1 and P2 may be defined by the third Bezier curve of (0.17×5.3, 0.47×4.9) and (0.87×5.3, 0.79×4.9).

The cross-section of the second surface S3 may be defined by Bezier curve of 1≤N≤4. When N is 2, the second Bezier curve equation in relation with the second surface S3 may be indicated by the above-mentioned formula 2.

In the formula 2, when the coordinate values of the start point P0 and the end point P2 of the curved line are, respectively, defined by (0,0) and (XE3, ZE3), the coordinate of the remaining control point P1 may be (a31×XE3, b31×ZE3). Therefore, the position of the control point P1 may be controlled by controlling the coefficients a31 and b31, and the curved form of the cross-section of the second surface S3 may be controlled by controlling the position of the control point P1.

Here, the parameters XE3, ZE3, a31 and b31 for determining the curved form of the cross-section of the second surface S3 may be defined as shown in the Table 1.

Referring to FIG. 1, the curved line of the cross-section of the second surface S3 may be set in such a manner that the X coordinate (XE3) and the Z coordinate (ZE3) of the end point P2 and the coefficients a31 and b31 for determining the coordinate of the remaining control point P1, respectively, satisfy −2≤XE3≤2, −12≤ZE3≤0, 0≤a31≤12, 0≤b31≤1.2.

Figure 4C:
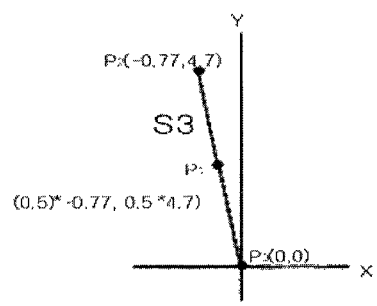

FIG. 4C illustrates the curved form of the cross-section of the second surface S3 defined by the Bezier curve equation. In FIG. 4C, the curved line of the cross-section of the second surface S3 may start at P0(0,0) and end at P2(−0.77, 4.7), the coefficients a31 and b31 of the Bezier curve equation for defining the curved line may be, respectively, 0.5 and 0.5, and a position of the remaining control point P1 may be defined by the second Bezier curve of (0.5×−0.77, 0.5×4.7).

Figure 4D:
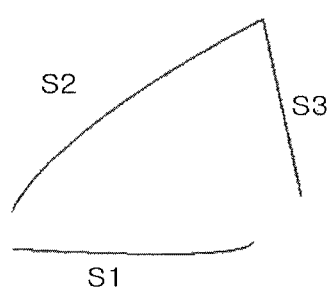

FIG. 4D illustrates the curved lines of the cross-sections of the protruder S1, the first and second surfaces S2 and S3 defined through FIGS. 4A, 4B and 4C may be combined to form external surfaces of the optical lens 120.

The cross-section of the optical lens 120 taken not in the X-axis direction, but in the Y-axis direction perpendicular to the X-axis direction may be defined by Bezier curve so that the protruder S1, the first surface S2, and the second surface S3, respectively, have predetermined curvatures.

In the case that the cross-section of the optical lens 120 taken in the Y-axis direction is defined by Bezier curve equation, coefficients of Bezier curve equation in order to define the curvature of the cross-section taken in the Y-axis direction may be set in such a manner that a coefficient ratio (T) of the case that the optical lens 120 is cut in the X-axis direction and the case that the optical lens 120 is cut in the Y-axis direction satisfies the range of $1 \leq T \leq 5$. For example, in order to make the coefficient ratio (T) of the case that the optical lens 120 is cut in the X-axis direction and the case that the optical lens 120 is cut in the Y-axis direction is 2.5, the coefficient of Bezier curve equation to define the curved line of the cross-section taken in the Y-axis direction may be determined.

As shown in FIG. 3, in the case that the light emitter 110 is located outside of the optical lens 120, in order to secure uniformity of brightness, the protruder S1 and the light emitter 110 may be spaced apart from each other by a predetermined interval. For example, a gap G between the protruder S1 and the light emitter 110 may satisfy $0.1 \text{ mm} \leq G \leq 2 \text{ mm}$.

The optical lens 120 disposed to provide the above-mentioned characteristics provides a first optical path along which some of the incident light may be reflected to the second surface S3 by the first surface S2 and refracted through the second surface S3 to exit to the outside, and in a second path along which some of the incident light may be reflected to the first surface S2 by the second surface S3 and refracted through the first surface S2 to exit to the outside.

Hereinafter, referring to FIG. 5, optical characteristics of the optical lens according to this embodiment will be described in detail.

The protruder S1 of the optical lens 120 may function to refract incident light received from the light emitter 110 and to direct the light to the first surface S2 or the second surface S3. When exit light from the light emitter 110 is incident, the protruder S1 refracts the light according to incident angles and directs the light into the optical lens 120.

When the light passing inside of the optical lens 120 is incident on the first surface S2, the light is reflected to be incident to the second surface S3, which refracts the light to exit the light outside of the optical lens 120. When the light is incident on the second surface S3, it is reflected by the second surface S3 to be incident on the first surface S2, which refracts the light to exit the light outside of the optical lens 120.

In FIG. 5, the progress angle of light coincides with the optical axis OA and is defined by the left hand rule based on the Y axis which is horizontal with the progress angle of light. That is, the Y axis is the axis of rotation, the clockwise direction becomes a positive (+) angle and the counterclockwise direction becomes a negative (−) angle. Here, the Y axis is parallel with the optical axis OA.

For convenience in description, angles that exit light from the light emitter 110 enters the protruder S1 are defined as θ1 and θ2, and angles that the light refracted through the protruder S1 progresses to the first surface S2 and the second surface S3 are defined as θ3 and θ4. Moreover, angles that the light reflected from the first surface S2 and the second surface S3 are refracted through the second surface S3 and the first surface S2 and exit to the outside are, respectively, defined as θ5 and θ6.

Referring to FIG. 5, the first surface S2 on the first optical path may function as a reflective surface to reflect some of the incident light from the protruder S1 to the second surface S3. That is, some of the light refracted from the protruder S1 is reflected at the first surface S2, incident to the second surface S3 and refracted by the second surface S3, and then, exits to the outside of the optical lens 120.

The light progressing along the first optical path satisfies 'exit angle/incident angle>0'.

A first light L1 of FIG. 5 will be described hereinbelow. Out of the incident light from the light emitter 110, the first light L1, which is incident to the optical member 120 at an angle of θ1 is refracted by the protruder S1, and thus, the progress angle is changed to θ3. The first light L1, which is incident at the angle of θ3, is incident to the first surface S2, and then, is reflected by the first surface S2. The first light L1 reflected by the first surface S2 is incident to the second surface S3 and refracted by the second surface S3, and then, exits to the outside at an angle of θ5.

The optical path of the first light L1 is as follows. The first light L1 is reflected from the first surface S2 after being incident at the positive angle θ1, and then exits to the outside after being refracted through the second surface S3 at the positive angle θ5. Therefore, because the incident angle θ1 and the exit angle θ5 are all positive angles, it satisfies: θ5/θ1>0.

On the second optical path, the first surface S2 functions as a refractive surface that refracts the light reflected from the second surface S3 and exits the light outside of the optical member 120. That is, some of the light refracted from the protruder S1 passes through the first surface S2 after being reflected from the second surface S3, and the first surface S2 exits it outside of the optical member 120 after refracting the light. The light progressing along the second optical path satisfies: exit angle/incident angle<0.

A second light L2 of FIG. 5 will be described hereinbelow. Out of the incident light from the light emitter 110, the second light L2, which is incident at an angle of θ2, is refracted by the protruder S1, and thus, the angle is changed to θ4. The second light L2, which is incident at the angle of θ4, is incident to the second surface S3, and then, is reflected by the second surface S3. The second light reflected by the second surface S3 is incident to the first surface S2 and refracted by the first surface S2, and then, exits to the outside at an angle of θ6.

The optical path of the second light L2 is as follows. The second light L2 is reflected by the second surface S3 after being incident at the positive angle θ2, and then exits to the outside after being refracted by the first surface S2 at the negative angle θ6. Therefore, because one of the incident angle and the exit angle is a negative angle and the other is a positive angle, it satisfies: θ6/θ2<0.

The optical lens 120 may pass some of the incident light, which satisfies predetermined conditions, to the first optical path or the second optical path. For example, the optical lens 120 may pass some of the incident light, which passes through the protruder S1 and has an angle within the range of ±60 degrees, to the first optical path or the second optical path. In order to satisfy the condition that the angle at which the light passes through the protruder S1 is within the range of ±60 degrees, the range of the incident angle is in the range of ±85 degrees. That is, the protruder S1 refracts some of the incident light which is within the range of ±85 degrees, so as to pass the light at the angle of ±60 degrees. When the angle of the light passing through the protruder S1 is within the range of ±60 degrees, the light is incident to the first surface S2 or the second surface S3 passes to the first optical path or the second optical path, and then, exits outside of the optical lens 120. The protruder S1 refracts some of the incident light, which satisfies predetermined conditions, to be incident to the first surface S2, and then, refracts the remaining light to be incident to the second surface S3.

For example, the protruder S1 refracts some of the incident light, whose incident angle is within a range of ±80 degrees, so as to pass to the first surface S2, and then, refracts the remaining light so as to progress to the second surface S3. As described above, some of the incident light which is incident to the first surface S2 after passing through the protruder S1 is reflected to the second surface S3, and the remaining light is refracted to exit to the outside.

In other words, referring to FIG. 5, in the case that the optical lens 120 is divided into two virtual zones using a virtual cross-section including the optical axis OA, the first optical path and the second optical path inside the same zone may pass in laterally opposite directions to each other relative to the optical axis. FIG. 5 illustrates an example of the optical path in the right side zone when the optical lens 120 is divided into two zones based on the optical axis OA.

The first light L1 passing to the first optical path and the second light L2 passing to the second optical path will be described hereinbelow. When the first surface S2 functions as the reflective surface, the first light L1 passes in the right side direction relative to the optical axis OA and exits to the outside, but when the second surface S3 functions as the reflective surface, the second light L2 passes in the left side direction relative to the optical axis and exits to the outside.

When the incident light or the light after being refracted by the protruder S1 except the incident light or the light within a range of approximately −10 degrees to +10 degrees relative to the optical axis OA is defined by $(\theta 5-180)/\theta 6=K$, the optical lens 120 according to this embodiment is designed to satisfy: $0.25 \leq K \leq 2.5$.

In other words, when the exit angle of the light passing to the first optical path is converted ($\theta 5-180$) to be laterally symmetrical on the basis of the optical axis OA, and the converted value is indicated as a ratio K relative to the exit angle $\theta 6$ of the light passing to the second optical path, in order to enhance uniformity of brightness, the optical lens 120 must be designed in such a manner that K is within the range of approximately 0.25 to 2.5.

The first optical path and the second optical path may pass in the vertically opposite directions to each other relative to a virtual axis which is perpendicular to the optical axis.

The first light L1 passing along the first optical path and the second light L2 passing along the second optical path will be described hereinbelow. When the first surface S2 functions as the reflective surface, the first light L1 passes in a downward direction relative to a virtual axis substantially perpendicular to the optical axis and exits to the outside, but when the second surface S3 functions as the reflective surface, the second light L2 passes in an upward direction relative to the virtual axis and exits to the outside.

As described above, the optical lens 120 may make laterally opposite optical paths and vertically opposite optical paths using the two surfaces at the same time so as to effectively diffuse the exit light in all directions. Therefore, the light emitter 110 to which the optical lens 120 is applied has enhanced uniformity of brightness and a wide coverage area, and thus, is fit to form a surface light source.

FIGS. 3 to 5 illustrate an optical lens according to an embodiment. Referring to FIGS. 3 to 5, the optical lens may be configured in the form of a straight line structure or a curved line structure which is formed by arrangement of the optical lens. Alternatively, the optical lens may be embodied in the form of a two-dimensional structure or a three-dimensional structure which is formed by arrangement of the optical lens.

Figure 6:
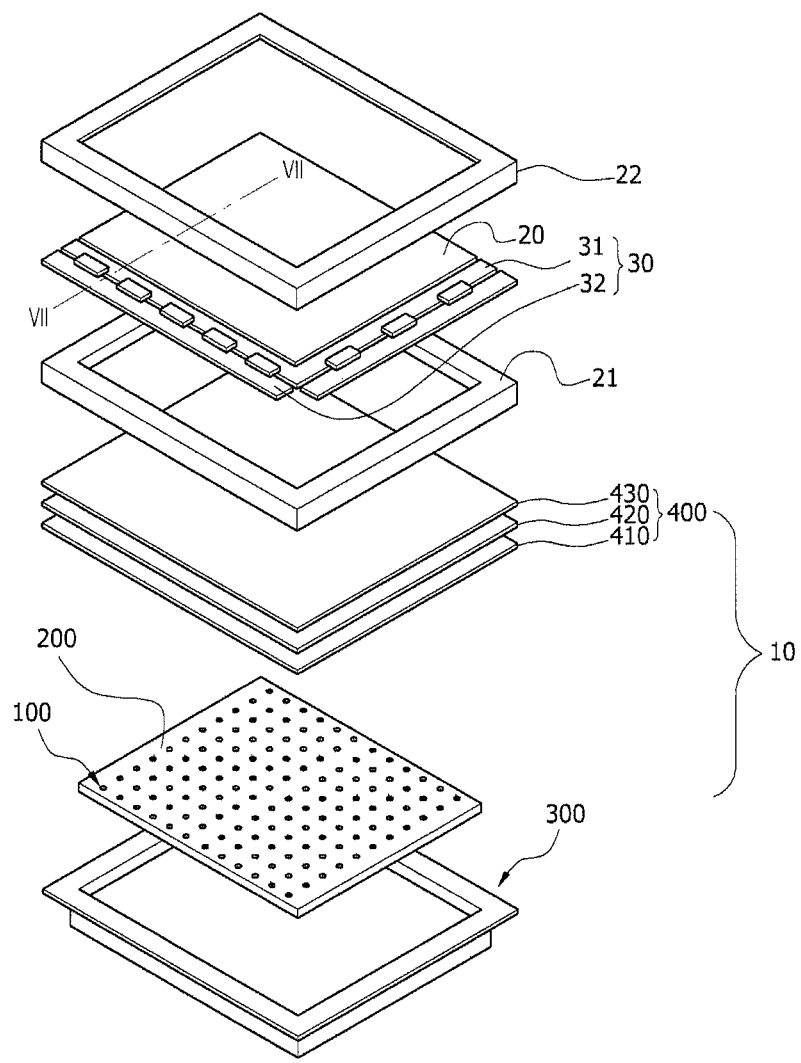
FIG. 6 is an exploded perspective view of a liquid crystal display (LCD) according to an embodiment.

FIG. 6 is an exploded perspective view of a liquid crystal display (LCD) according to an embodiment. The optical lens described above may be applied to the liquid crystal display. Additionally, FIG. 7 is a partial cross-sectional view of the liquid crystal display of FIG. 6, taken along line of VII-VII of FIG. 6.

Figure 7:
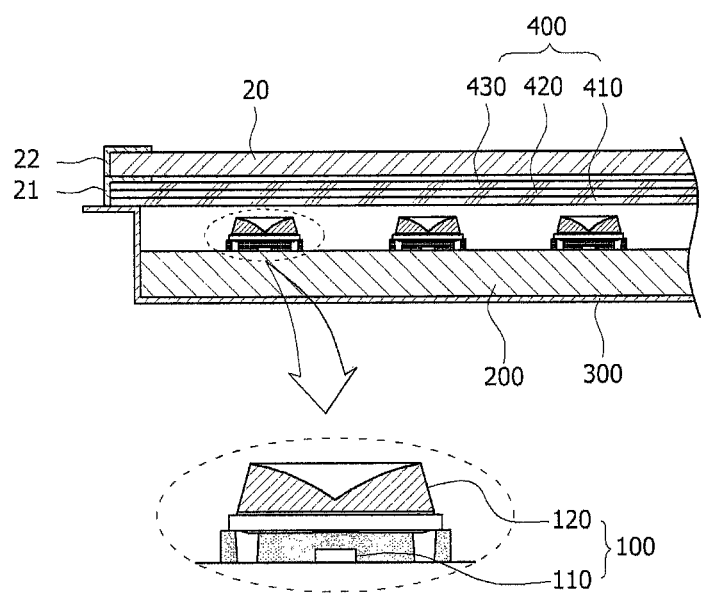
FIG. 7 is a partial cross-sectional view of a backlight of the LCD of FIG. 6, taken along line VII-VII.

Referring to FIGS. 6 and 7, the liquid crystal display according to this embodiment may include a backlight 10 and a liquid crystal panel 20. The liquid crystal panel 20 may be a display of the liquid crystal display, and may include a thin film transistor (TFT) substrate, a color filter substrate, and a liquid crystal layer interposed between the thin film transistor substrate and the color filter substrate. The thin film transistor substrate may include a plurality of gate lines, a plurality of data lines that cross the plurality of gate lines, and a thin film transistor formed at a crossing area of each gate line and each data line.

A drive circuit 30 may be connected to one side of the liquid crystal panel 20. The drive circuit 30 may include a printed circuit board (PCB) 31 to supply a scan signal to the gate lines of the thin film transistor substrate, and a PCB 32 to supply a data signal to the data lines. The drive circuit 30 may be electrically connected with the liquid crystal panel 20 in the manner of COF (Chip on Film), TCP (Tape Carrier Package), or another method.

The liquid crystal display may include a panel guide 21 to support the liquid crystal panel 20, and an upper case 22 that surrounds edges of the liquid crystal panel 20 and may be joined with the panel guide 21.

The backlight 10 may be a direct type, may be joined to the liquid crystal panel 20, and may include a bottom cover 300, a drive substrate 200, a plurality of light sources (or light emitters) 100, and a plurality of optical sheets 400. The bottom cover 300 may be made of metal, and may have a box shape which is open at the top. For example, the bottom cover 300 may be formed by a metal plate bent or curved.

The drive substrate 200 may be accommodated in a space formed by the bottom cover 300 bent or curved. Moreover, the bottom cover 300 may function to support the plurality of optical sheets 400 and the liquid crystal panel 20.

The drive substrate 200 may have a plate shape and may have a reflective layer. The reflective layer may reflect light irradiated from the plurality of light sources 100 so as to enhance performance of the backlight 10.

The plurality of light sources 100 may be mounted on the drive substrate 200. Each of the plurality of light sources 100 may include the optical lens 120 arranged to cover a light emitter 110. FIGS. 6 and 7 show the light emitter 110 as light emitting diodes; however, embodiments are not so limited.

Each of the light emitters 110 may be arranged on the drive substrate 200 and may be electrically connected to the drive substrate 200. The light emitters 110 may emit light according to a driving signal supplied from the drive substrate 200.

The light emitters 110 may operate as point light sources, and an array of light emitters 110 arranged on the drive substrate 200 at predetermined intervals may form a surface light source.

Each light emitter 110 may be disposed in the form of a light emitting diode package including light emitting diode chips. The light emitter 110 may irradiate white light or evenly irradiate green light, blue light, and red light.

When light irradiated from the light emitter 110 is incident, the optical lens 120 may control luminous flux so as to enhance uniformity of brightness. The optical lens 120 may be disposed separately from the light emitter 110. Further, the optical lens 120 may be disposed in the IOL type in which the light emitter 110 is accommodated.

FIG. 7 illustrates the optical lens 120 and light emitter 110 spaced apart from each other at predetermined intervals; however, embodiments are not so limited. According to embodiments, a plurality of the optical lenses 120 spaced apart at predetermined intervals corresponding to the light emitters 110 may be joined into one structure.

The plurality of optical sheets 400 may include a diffusion sheet 410, a polarizing sheet 420, and a prism sheet 430, and may be used to enhance characteristics of light passing through the plurality of optical sheets 400. The diffusion sheet 410 may spread the incident light from the light emitters 100 across a front surface of the liquid crystal panel 20, diffuse the light so as to be evenly distributed in a wide range, and then, irradiate the light to the liquid crystal panel 20. The polarizing sheet 420 may function to polarize any inclined incident light of incident light so that it exits vertically. In order to vertically change the exit light from the diffusion sheet 410, at least one polarizing sheet 420 may be arranged beneath the liquid crystal panel 20. The prism sheet 430 may transmit light aligned with its transmission axis but reflect light at right angles to the transmission axis.

In order to sufficiently secure uniformity of brightness, the backlight 10 may have an air gap of a predetermined size between the light emitter 110 and the optical lens 120. Moreover, in order to secure a wide distribution of brightness, a size of the light emitter 110 may be reduced or a size of the optical lens 120 may be increased, such that uniformity of brightness may be secured.

Recently, with an increase in demand of ultra-thin liquid crystal displays, there have been attempts to reduce the air gap between the light emitter 110 and the optical lens 120. However, the reduced air gap may cause a limitation in increasing the size of the optical lens 120 and cause difficulty in securing uniformity of brightness.

Therefore, as described above, with this embodiment, the optical lens 120 may have two surfaces that function as reflective and refractive surfaces at the same time so as to simultaneously make laterally and vertically opposed optical paths, such that exit light from the light emitter 110 may be effectively diffused. Therefore, the backlight 10 may exit light with enhanced uniformity of brightness to the liquid crystal panel 20, and thus, the liquid crystal display 20 may provide enhanced uniformity of brightness and enhanced image quality.

Hereinafter, referring to FIGS. 8 to 17, an optical lens, a light emitting device including the optical lens, and a display according to another embodiment will be described in detail. With this embodiment, in order to secure uniformity of brightness, a surface may be treated to scatter some of incident light into the optical lens.

Figure 8:
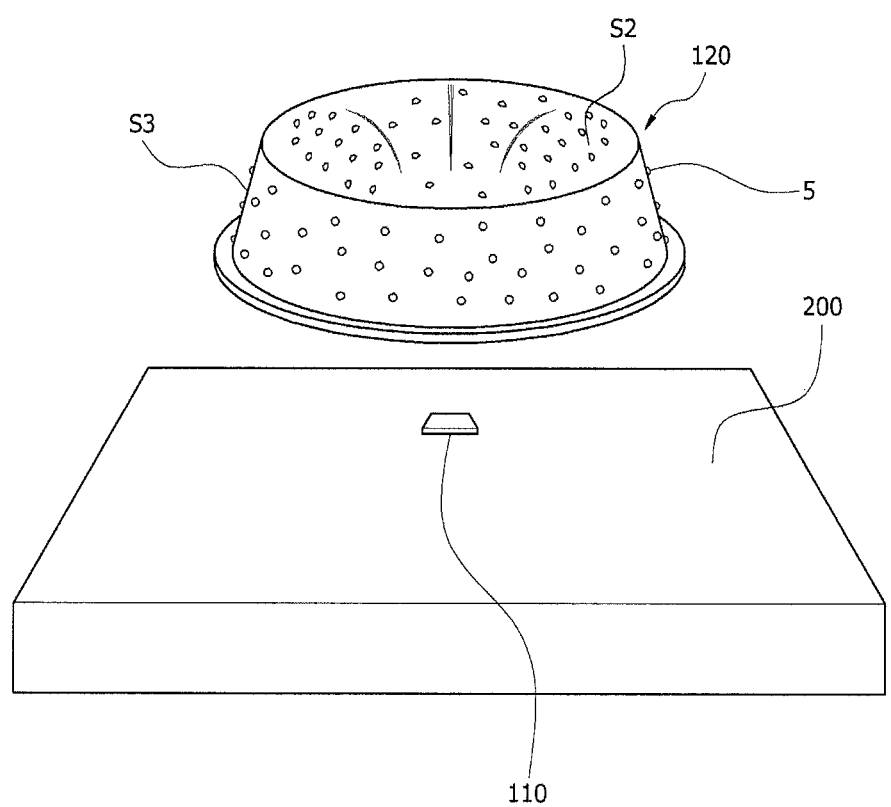
FIG. 8 is an exploded perspective view of a light emitting device according to another embodiment.
Figure 9:
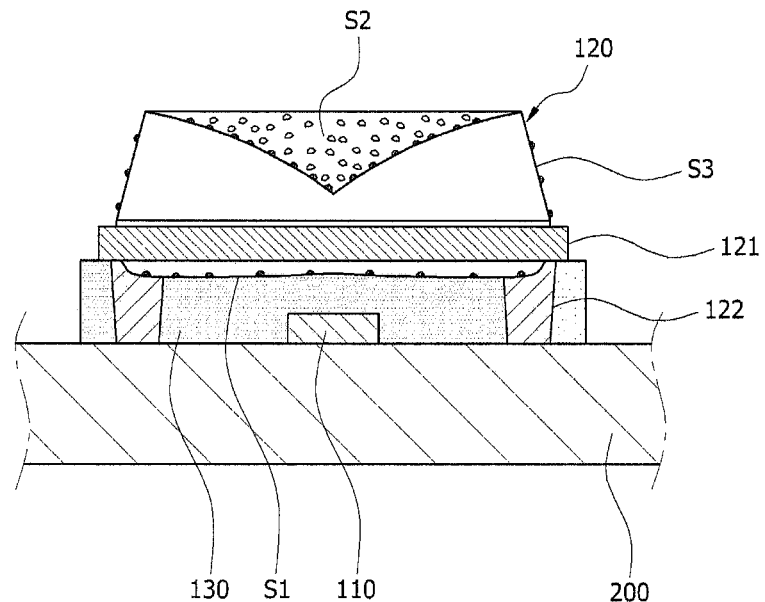
FIG. 9 is a cross-sectional view of the light emitting device of FIG. 8.
Figure 10:
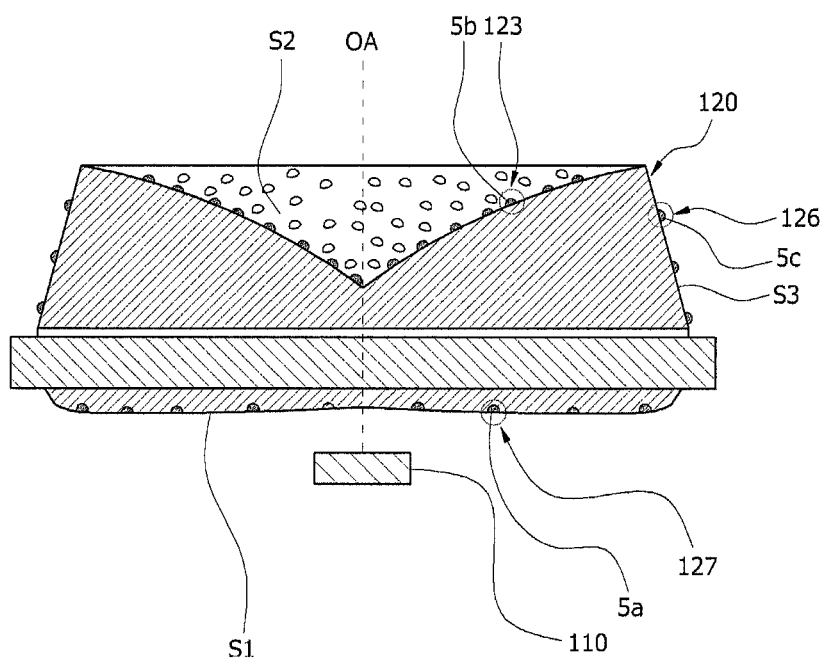
FIG. 10 is a cross-sectional view of an optical lens of the light emitting device of FIG. 8.
Figure 11:
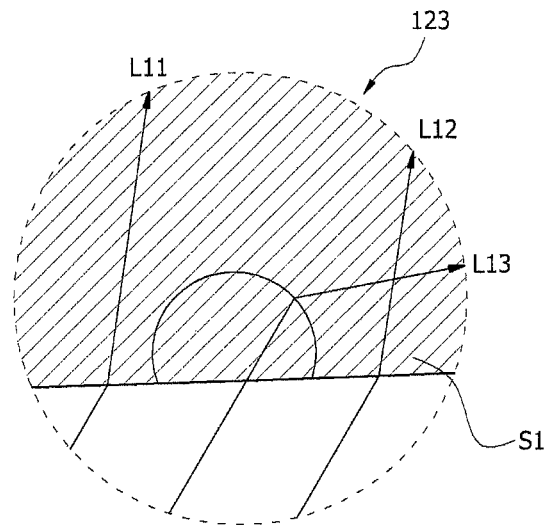
FIGS. 11-13 are views showing light scattered by micropatterns of the optical lens of FIG. 10.
Figure 12:
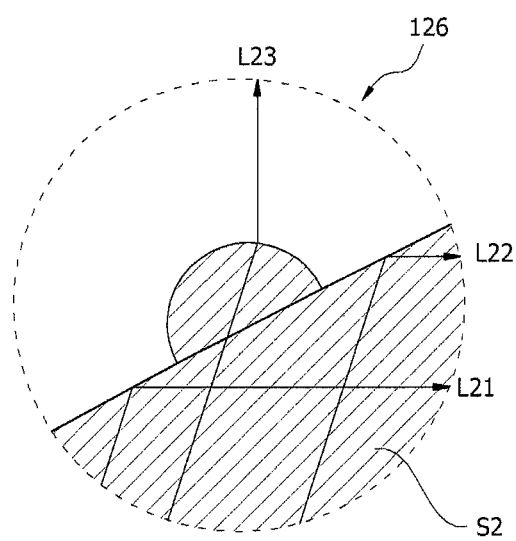
Figure 13:
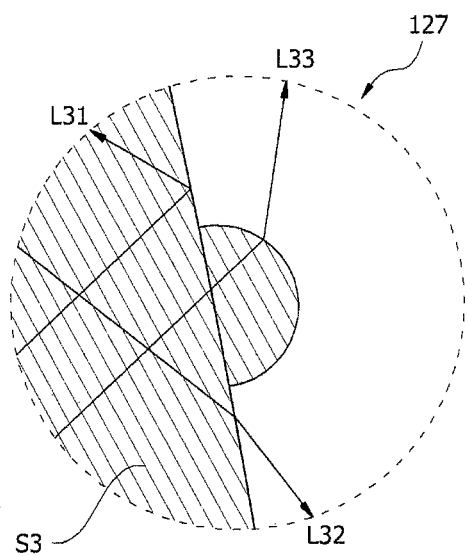

FIG. 8 is an exploded perspective view of a light emitting device according to another embodiment. FIG. 9 is a cross-sectional view of the light emitting device of FIG. 8. FIG. 10 is a sectional view of an optical lens of the light emitting device of FIG. 8. FIGS. 11-13 are views showing light scattered by micro-patterns of the optical lens of FIG. 10. FIGS. 14A to 15F are views of a section of an uneven portion formed on a surface of an optical lens according to various embodiments.

Referring to FIGS. 8 and 9, the light emitting device may include a light emitter 110, an optical lens 120, and a drive substrate 200. The light emitter 110 may be arranged on the drive substrate 200, and may be electrically connected to a circuit pattern formed on the drive substrate 200. The light emitter 110 may receive an electric signal from the circuit pattern of the drive substrate 200, and function as a light source that converts the electric signal into an optical signal and outputs the optical signal. The light emitter 110 may be a light emitting diode (LED) that operates as a point light source, for example.

The optical lens 120 may control a light path by refracting incident light from the light emitter 110, so as to enhance uniformity of brightness of the light emitter 110. The optical lens 120 may be arranged to cover at least a portion of the light emitter 110. The optical lens 120 may have an upper surface sunken or concave toward the light emitter 110.

The optical lens 120 may scatter some of the light passing through the optical lens 120 in order to secure uniformity of brightness. That is, at least one of surfaces S1, S2, and S3 of the optical lens 120 may have a scattering portion formed through control of surface roughness. The scattering portion may be in the form of micro-patterns 5.

As shown in FIG. 9, the optical lens 120 may be separated from the light emitter 110. In this case, a filler material 130 may surround the light emitter 110, and the optical lens 120 may be arranged on the filler material 130. Moreover, the light emitted from the light emitter 110 may pass through the filler material 130, and then, enter the optical lens 120 through a surface opposed to the light emitter 110.

The optical lens 120 may be an IOL (Integrated Optical Lens) type in which at least a portion of the light emitter 110 is accommodated in the optical lens 120, namely, a type integrated with the light emitter. That is, light exiting from the light emitter 110 may be incident to the optical lens 120 through an interface of the optical lens 120 in contact with an external surface of the light emitter 110.

In FIGS. 8 and 9, the optical lens 120 may include a flange 121 and a plurality of supports 122 formed on the flange 121 to support the optical lens 120 on the drive substrate 200; however, embodiments are not limited thereto. With this embodiment, the optical lens 120 may be configured without the flange or the supports.

Further, FIG. 9 illustrates one light emitter 110 and one optical lens 120 arranged on one drive substrate 200; however, embodiments are not limited thereto. For example, a plurality of light emitters 110 may be arranged on one drive substrate 200. Additionally, a plurality of optical lenses 120 may be arranged in correspondence with one light emitter 110.

Hereinafter, referring to FIG. 10, a shape of the optical lens according to this embodiment will be described in detail hereinbelow.

FIG. 10 is a sectional view of the optical lens taken in the Y-axis direction. Referring to FIG. 10, the optical lens 120 may include a protruder S1, onto which light may be incident from the light emitter 110, a first surface S2 sunken or concave toward the protruder S1 or the light emitter 110, and a second surface S3 that extends from an outer rim 124 of the first surface S2, and may be formed as one solid body. In the case that the light emitter 110 is located outside of the optical lens 120, the protruder S1 may be formed on a bottom surface of the optical lens 120, which may be opposed to the light emitter 110.

FIGS. 8 to 10 illustrate the light source is located outside of the optical lens 120; however, the optical lens 120 may be the IOL type which contains the light emitter therein. That is, the protruder S1 of the optical lens 120 may not be an external surface of the optical lens 120, but rather, an internal surface which corresponds to an interface between the optical lens 120 and the light emitter 110.

The protruder S1 may include a curved surface having a predetermined curvature. For example, the cross-section of the protruder S1 taken in the X-axis direction or the Y-axis direction may include a curved line section. The protruder S1 may include a planar surface. That is, the cross-section of the protruder S1 taken in the X-axis direction or the Y-axis direction may include a straight line section. The protruder S1 may have a cross-section taken in the X-axis direction or in the Y-axis direction, which includes a straight line section. The protruder S1 may have a cross-section taken in the X-axis direction or in the Y-axis direction, which includes a curved line section.

The protruder S1 may have a rotationally symmetric structure based on the optical axis OA. In addition, the protruder S1 may have a rotationally asymmetric structure relative to the optical axis OA.

The optical axis OA may be defined as a virtual straight line that indicates a passage direction of light from a center of a three-dimensionally luminous flux of light exiting from the point light source. The optical axis OA may coincide with a virtual axis that extends to pass through centers of the protruder S1 and the first surface S2.

The protruder S1 may include micro-patterns formed on a surface thereof. The micro-patterns 5a may include a plurality of protrusions or a plurality of hollows formed on the surface of the protruder S1. That is, the protrusions or the hollows may be arranged randomly or regularly so as to form the micro-patterns 5a.

Figure 14A:
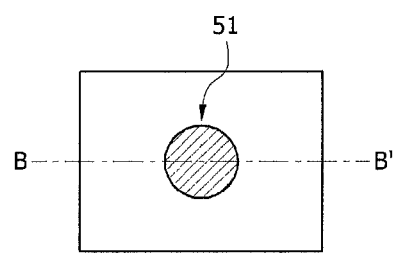
FIGS. 14A to 15F are views of a section of an uneven portion formed on a surface of an optical lens according to various embodiments.
Figure 14B:
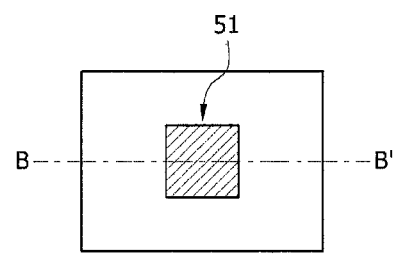
Figure 15A:
Figure 15B:
Figure 15C:
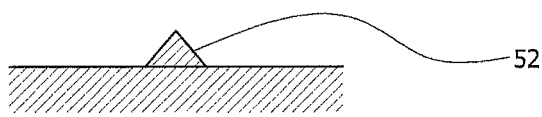
Figure 15D:
Figure 15E:
Figure 15F:

Referring to FIGS. 14A and 14B, a horizontal cross section 51 of the protrusions or hollows forming the micro-patterns may be in the form of a circle or rectangle. Moreover, referring to FIGS. 15A to 15F, a vertical cross section 52 of the protrusions or hollows forming the micro-pattern may be in the form of a rectangle, a semi-circle, and a triangle, for example.

In the case that the protrusions or hollows of the micro-patterns have shapes of the cross-sections illustrated, the protrusions or the hollows may have one of three-dimensional shapes of a hemisphere, a rectangular cylinder, a cylinder, a cone, a quadrangular pyramid, and a triangular pyramid, for example.

Shapes of the protrusions or hollows forming the micro-patterns are illustrated; however, embodiments are not limited thereto. The protrusions or hollows forming the micro-patterns may have one of various shapes. For example, the horizontal cross-section 51 of the protrusions or hollows forming the micro-patterns may be changed into various shapes, such as a triangle, a hexagon, a diamond, an oval, and other shapes, for example.

As described above, the micro-patterns 5a formed on the surface of the protruder S1 may provide surface roughness of or on the protruder S1, so as to scatter some of the light passing through the protruder S1.

In order to secure uniformity of brightness of light passing through the optical lens 120 and to prevent hot spot formed at or in a central area, a ratio of light scattered through the protruder S1, out of the light that passes through the protruder S1, may be less than approximately 0.30. That is, the micro-patterns 5a may be formed in such a manner that a ratio of an area that the protrusions or hollows of the micro-patterns 5a occupy to an entire surface area of the protruder S1 may be less than approximately 0.30.

Referring to FIG. 10, the first surface S2 may be formed on or at a top portion of the optical lens 120. Additionally, the first surface S2 may be formed at a position corresponding to the light emitter 110.

The first surface S2 may be formed at or in a central area of a top portion of the optical lens 120. A center of the first surface S2 may be located at the optical axis OA.

The first surface S2 may include a curved surface. That is, the cross-section of the first surface S2 taken in the X-axis direction or the Y-axis direction may include a curved line.

Moreover, the first surface S2 may include a planar surface. That is, the cross-section of the first surface S2 taken in the X-axis direction or the Y-axis direction may include a straight line.

A vertex of the first surface S2 sunken or concave toward the protruder S1 may be located on the optical axis OA and face the light emitter 110.

The first surface S2 may have a rotationally symmetric structure based on the optical axis OA. In addition, the first surface S2 may have a rotationally asymmetric structure relative to the optical axis OA.

The first surface S2 may include micro-patterns 5b formed on the surface. The micro-patterns 5b may include a plurality of protrusions or a plurality of hollows formed on the surface of the first surface S2. That is, the protrusions or the hollows may be arranged randomly or regularly so as to form the micro-patterns 5b.

A horizontal cross-section of the protrusions or hollows forming the micro-patterns 5b may be in the form of a rectangle, a circle, a triangle, a hexagon, a diamond, an oval, or other shapes, for example. Moreover, a vertical cross-section of the protrusions or hollows forming the micro-patterns 5b may be in the form of a rectangle, a semi-circle, a triangle, or other shapes, for example. Further, the protrusions or hollows of the micro-patterns 5b may have one of three-dimensional shapes of a hemisphere, a rectangular cylinder, a cylinder, a cone, a quadrangular pyramid, a triangular pyramid, or other shapes, for example.

The micro-patterns 5b formed on the surface of the first surface S2 may provide surface roughness of or on the first surface S2 so as to scatter some of the light passing through the first surface S2.

In order to secure uniformity of brightness of light passing through the optical lens 120 and to prevent hot spot formed at a central area, a ratio of the light scattered through the first surface S2 out of the light that passes through the optical lens 120 and enters the first surface S2 may be less than approximately 0.30. That is, the micro-patterns 5b may be formed in such a manner that a ratio of an area that the protrusions or hollows of the micro-patterns 5b occupy to an entire surface area of the first surface S2 may be less than approximately 0.30.

Referring to FIG. 10, the second surface S3 may be bent or curved from the outer rim 124 of the first surface S2. The second surface S3 may extend downwardly from the first surface S2 so as to form an exterior surface of the optical lens 120.

Herein, the term bending may mean a rapidly bent shape. For example, when two surfaces are bent while forming a curved surface with a radius of curvature of less than approximately 0.1 mm, it may be interpreted that the two surfaces are curved. Moreover, the term curve may mean a gently bent shape. For example, when two surfaces are bent while forming a curved surface with a radius of curvature of more than approximately 0.1 mm, it may be interpreted that the two surfaces are curved. Further, the term variation may mean that an aspect that the curved surface is changed is changed. For example, when the convex curve is changed into a concave curve, it may be interpreted that the convex curve and the concave curve are varied.

The second surface S3 may include a curved surface. That is, the cross-section of the second surface S3 taken in the X-axis direction or the Y-axis direction may include a curved line.

Moreover, the second surface S3 may include a planar surface. That is, the cross-section of the second surface S3 taken in the X-axis direction or the Y-axis direction may include a straight line.

The second surface S3 may have a slope of an acute angle to the protruder S1. Further, the second surface S3 may have a slope of a right angle to the protruder S1. The second surface S3 may have a slope of an obtuse angle to the protruder S1.

The second surface S3 may have a concave shaped central area which may be sunken or concave toward an inside of the optical lens 120. Additionally, the second surface S3 may have a convex shape a central area of which may protrude toward the outside of the optical lens 120.

The second surface S3 may have a rotationally symmetric structure based on the optical axis OA. In addition, the second surface S3 may have a rotationally asymmetric structure relative to the optical axis OA.

The second surface S3 may include micro-patterns 5c formed on the surface. The micro-patterns 5c may include a plurality of protrusions or a plurality of hollows formed on a surface of the second surface S3. That is, the protrusions or hollows may be arranged randomly or regularly so as to form the micro-patterns 5c.

A horizontal cross-section of the protrusions or hollows forming the micro-patterns 5c may be in the form of a rectangle, a circle, a triangle, a hexagon, a diamond, an oval, or other shapes, for example. Moreover, a vertical cross-section of the protrusions or hollows forming the micro-patterns 5c may be in the form of a rectangle, a semi-circle, a triangle, or other shapes, for example. Further, the protrusions or hollows of the micro-patterns 5c may have one of three-dimensional shapes of a hemisphere, a rectangular cylinder, a cylinder, a cone, a quadrangular pyramid, a triangular pyramid, or other shapes, for example.

The micro-patterns 5c formed on the surface of the second surface S3 may provide surface roughness of or an the second surface S3, so as to scatter some of the light passing through the second surface S3.

In order to secure uniformity of brightness of light passing through the optical lens 120 and to prevent hot spots formed at a central area, a ratio of the light scattered by the second surface S3 out of the light that passes through the optical lens 120 and enters the second surface S3 may satisfy less than approximately 0.30. That is, the micro-patterns 5c may be formed in such a manner that a ratio of an area that the protrusions or hollows of the micro-patterns 5c occupy to an entire surface area of the second surface S3 may be less than approximately 0.30.

FIG. 10 illustrates that the protruder S1, the first surface S2, and the second surface S3 may all include micro-patterns; however, embodiments are not limited thereto. The micro-patterns may be formed on at least one of the protruder S1, the first surface S2, and the second surface S3. In addition, FIG. 10 illustrates the micro-patterns distributed on an entire surface; however, the micro-patterns may be formed on a portion of each of the surfaces according to embodiments.

The micro-patterns to scatter light on the surfaces S1, S2, and S3 may be formed through or by various processes. For example, the micro-patterns may be formed through or by a molding process to form the micro-patterns during a molding process of the optical lens 120, through a matte corrosion process or a glossy corrosion process to forming the micro-patterns by corroding a surface of the optical lens 120 using electrical or chemical materials, or through a deposition process to form the micro-patterns by depositing scattered particles on the surfaces of the optical lens 120.

One of the first surface S2 or the second surface S3 of the optical lens 120 may function as a reflective surface for light passing inside of the optical lens 120. Of the first surface S2 and the second surface S3 all of the optical lens 120 may function as a reflective surface for light passing inside of the optical lens 120.

In the latter case, the optical lens 120 may pass some of the incident light to the first optical path, so that the incident light may be reflected to the second surface S3 by the first surface S2 and refracted by the second surface S3 to exit to the outside. The optical lens 120 may pass the remaining incident light to the second optical path, so that the incident light may be reflected by the first surface S2 to the second surface S3 and refracted by the first surface S2 to exit to the outside.

In order to simultaneously satisfy the first optical path and the second optical path, in the optical lens 120, the cross-sections of the protruder S1, the first surface S2, or the second surface S3 may be a curved line to satisfy the spline curve, which is nonlinearly numerical analysis. That is, the spline curve is a function to make a smooth curve using fewer control points and is defined by an interpolation curve passing through selected control points and an approximation curve, which is a line to connect the selected control points. For the spline curve, there are a B-spline curve, a Bezier curve, a non-uniform rational B-spline (NURBS) curve, a cubic spline curve, and others.

For example, the curved line section contained in the cross-section of each surface may be indicated through the Bezier curve equation. The Bezier curve equation is an equation to obtain various free curves by movement of a start point of the initial control points, an end point which is the final control point, and an interior control point located between the start point and the end point, and may be indicated by the above-mentioned formula 1.

It was previously described that the cross-sections of the protruder S1, the first surface S2, or the second surface S3 in the optical lens 120 may be defined by the Bezier curve equation with reference to Formulas 1 to 3, and hence, repetitive detailed description has been omitted.

Hereinafter, optical characteristics of the optical lens according to this embodiment will be described in detail hereinbelow.

When incident light is incident from the light emitter 110, the protruder S1 scatters or refracts the incident light and passes it to the inside of the optical lens 120.

The light refracted or scattered by the protruder S1 may be incident to the first surface S2 or the second surface S3.

FIG. 11 is an enlarged sectional view showing a portion 123 of a cross-section of the protruder S1 illustrated in FIG. 10, which includes hollows that form the micro-patterns 5a. Referring to FIG. 11, out of light L11, L12 and L13 incident toward the protruder S1, the lights L11 and L12, which are incident to a surface where the hollows are not formed, are refracted by the protruder S1. On the other hand, the light L13, which is incident to the hollows, is scattered by the hollows.

The first surface S2 reflects or scatters some of the incident light passing inside of the optical lens 120, and then, passes the scattered light to the inside of the optical lens 120. That is, at least some of the light reflected or scattered by the first surface S2 may be incident to the second surface S3.

Moreover, the first surface S2 refracts or scatters some of the incident light passing inside of the optical lens 120, and then the light exits outside of the optical lens 120. The light refracted or scattered by the first surface S2 may contain light reflected by the second surface S3 after passing through the protruder S1.

FIG. 12 is an enlarged sectional view showing a portion 126 of a cross-section of the first surface S2 illustrated in FIG. 10, which includes protrusions forming the micro-patterns 5b. Referring to FIG. 12, out of the light L21, L22 and L23 incident toward the first surface S2, the light L21 and L22, which are incident to a surface where the protrusions are not formed, are reflected by the first surface S2, and then, are passed inside of the optical lens 120. On the other hand, the light L23, which is incident to the protrusions, is scattered outside of the optical lens 120 by the protrusions.

The second surface S3 refracts or scatters some of the incident light passing inside of the optical lens 120, and then, the light exits outside of the optical lens 120. The light refracted or scattered by the second surface S3 may contain light reflected by the first surface S2 after passing through the protruder S1.

Further, the second surface S3 reflects or scatters some of the incident light passing inside of the optical lens 120. That is, at least some of the light reflected by the second surface S3 may enter the first surface S2.

FIG. 13 is an enlarged sectional view showing a portion 127 of a cross-section of the second surface S3 illustrated in FIG. 10, which includes protrusions forming the micro-patterns 5c. Referring to FIG. 13, out of the light L31, L32 and L33 incident toward the second surface S3, the light L31 and L32, which are incident to a surface where the protrusions are not formed, are passed to the inside of the optical lens 120 after being reflected by the second surface S3, or exit outside of the optical lens 120 after being refracted by the second surface S3. The light passing to the inside of the optical lens 120 after being reflected by the second surface S3 enters the first surface S2. On the other hand, the light L33, which is incident to the protrusions, is scattered outside of the optical lens 120 by the protrusions.

Out of the incident light, the light passing along the first optical path where the light enters the second surface S3 after being reflected by the first surface S2 and exits to the outside after being refracted by the second surface S3 may satisfy: exit angle/incident angle>0 relative to the optical lens 120. For example, the incident light is incident at a positive angle relative to the protruder S1, is reflected at a positive angle by the first surface S2 and refracted at a positive angle by the second surface S3, and then, exits outside of the optical lens 120. Alternatively, for example, the incident light is incident at a negative angle relative to the protruder S1, is reflected at a negative angle by the first surface S2 and refracted at a negative angle by the second surface S3, and then, exits outside of the optical lens 120.

Additionally, out of the incident light, the light passing to the second optical path where the light enters the first surface S2 after being reflected by the second surface S3 and exits to the outside after being refracted by the first surface S2 may satisfy: exit angle/incident angle<0 relative to the optical lens 120. For example, the incident light is incident at a positive angle relative to protruder S1, is reflected at a negative angle by the second surface S3 and refracted at a negative angle by the first surface S2, and then, exits to the outside of the optical lens 120. Alternatively, for example, the incident light is incident at a negative angle relative to the incident surface S1, is reflected at a positive angle by the second surface S3 and refracted at a positive angle by the first surface S2, and then, exits outside of the optical lens 120.

Here, the incident angle and the exit angle may coincide with the optical axis OA and be defined by the left hand rule based on the Y axis which is horizontal with the angles. That is, the Y axis is the axis of rotation, the clockwise direction becomes a positive (+) angle and the counterclockwise direction becomes a negative (−) angle. Here, the Y axis is parallel with the optical axis OA.

Meanwhile, FIG. 10 illustrates the optical lens according to this embodiment. Referring to FIG. 10, the optical lens may be embodied in the form of a straight line structure or a curved line structure which is formed by an arrangement of optical lenses. Alternatively, the optical lens may be embodied in the form of a two-dimensional structure or a three-dimensional structure which is formed by an arrangement of the optical lenses.

The light emitting device according to this embodiment may be applied to a liquid crystal display such as that described with reference to FIG. 6.

Figure 16:
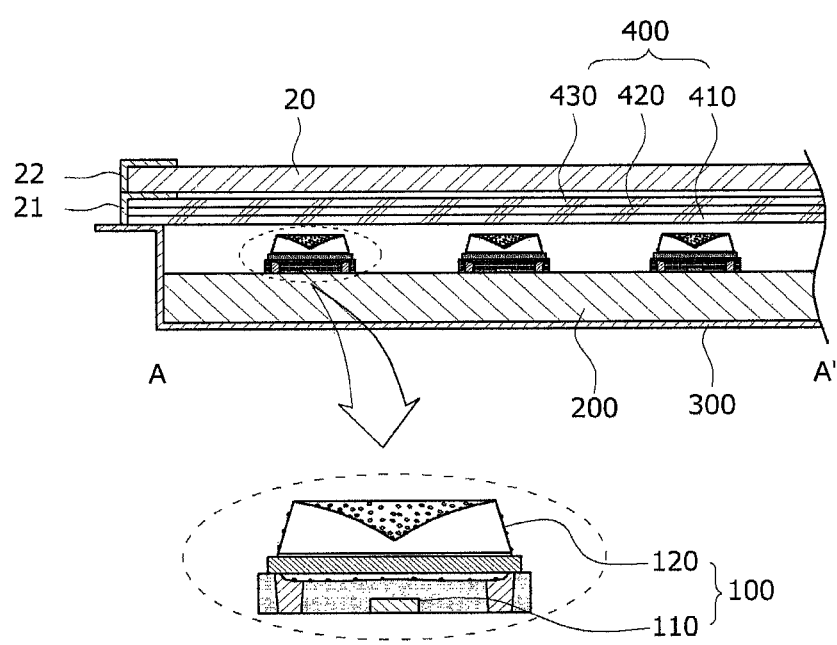
FIG. 16 is a partial cross-sectional view of a backlight according to another embodiment.

FIG. 16 is a partial sectional view of a backlight according to another embodiment. Referring to FIG. 16, the backlight 10 may be a direct type, may be joined to the liquid crystal panel 20 (see reference numeral 20 in FIG. 6), and may include a bottom cover 300, a drive substrate 200, a plurality of light sources 100, and a plurality of optical sheets 400. The bottom cover 300 may be made of metal, and may adopt a box shape which is open at the top.

A plurality of light sources 100 may be mounted on the drive substrate 200. Each of the light sources 100 may include an optical lens 120 arranged to cover a light emitter 110. The light emitter 110 may be a light emitting diode, for example.

Each of the light emitters 110 may be arranged on the drive substrate 200 and may be electrically connected to the drive substrate 200. The light emitters 110 may emit light according to a drive signal supplied from the drive substrate 200.

The light emitters 110 may operate as point light sources, and an array of the light emitters 110 arranged on the drive substrate 200 at predetermined intervals may form a surface light source. Each light emitter 110 may be disposed in the form of a light emitting diode package including light emitting diode chips. The light emitter 110 may irradiate white light or evenly irradiate green light, blue light, and red light.

When light irradiated from the light emitter 110 is incident, the optical lens 120 may control luminous flux so as to enhance uniformity of brightness. The optical lens 120 may include micro-patterns formed on at least one of the surfaces of the optical lens 120 so as to scatter some of the light which is incident to the optical lens 120 or passes the optical lens 120.

The optical sheets 400 may include a diffusion sheet 410, a polarizing sheet 420, and a prism sheet 430, and may be used to enhance characteristics of light passing through the optical sheets 400.

According to this embodiment, the optical lens may have micro-patterns formed on at least one of surfaces to scatter light and also has two surfaces simultaneously functioning as the reflective surface and the refractive surface, so as to widen an optical emission angle and enhance uniformity of brightness. Therefore, embodiments disclosed herein may effectively diffuse exit light from a light emitting device. Moreover, the backlight may send light having enhanced uniformity of brightness onto a liquid crystal panel, and thus, the liquid crystal display may provide enhanced uniformity of brightness and enhanced image quality.

Accordingly, embodiments disclosed herein solve problems occurring in the prior art, and provide an optical lens, light emitting device, and display, which may enhance uniformity of brightness.

Embodiments disclosed herein provide an optical lens that may include a protruder having a convex part or portion; a first surface having a center sunken toward the protruder and an edge connected with the center with a curved line, the first surface being spaced apart from the protruder in a direction of an optical axis, which is a straight line that passes through the center and a center of the protruder; and a second surface bent from the edge of the first surface. An angle between a cross section substantially perpendicular to the optical axis and the second surface above the cross section may be an acute angle, and a ratio of a diameter of the protruder to a distance ranging from the protruder to a plane surface including the edge may satisfy approximately 0.5 to 5.

Embodiments disclosed herein provide a light emitting device that may include a substrate; a plurality of light sources arranged on the substrate; and a plurality of optical lenses arranged on the plurality of light sources. The optical lens may include a protruder having a convex part or portion; a first surface having a center sunken toward the protruder and an edge connected with the center with a curved line, the first surface being spaced apart from the protruder in a direction of an optical axis, which is a straight line that passes through the center and a center of the protruder; and a second surface bent from the edge of the second surface. An angle between a cross section perpendicular to the optical axis and the second surface above the cross section may be an acute angle, and a ratio of a diameter of the protruder to a distance ranging from the protruder to a plane surface including the edge may satisfy approximately 0.5 to 5.

Embodiments disclosed herein provide a display that may include a backlight unit or backlight having a substrate; a plurality of light sources arranged on the substrate; and a plurality of optical lenses arranged on the plural light sources; a liquid crystal panel arranged on the backlight unit; and a driving circuit part or drive circuit electrically connected to the liquid crystal panel. The optical lens may include an protruder having a convex part or portion; a first surface having a center sunken toward the protruder and an edge connected with the center with a curved line, the first surface being spaced apart from the protruder in a direction of an optical axis, which is a straight line that passes through the center and a center of the protruder; and a second surface bent from the edge of the second surface. An angle between a cross section perpendicular to the optical axis and the second surface above the cross section may be an acute angle, and a ratio of a diameter of the protruder to a distance ranging from the protruder to a plane surface including the edge may satisfy approximately 0.5 to 5.

Embodiments disclosed herein provide an optical lens that may include a protruder having a curved surface; a first surface having a center sunken toward the protruder and an edge connected with the center with a curved line, the first surface being spaced apart from the protruder in a direction of an optical axis, which is a virtual straight line that passes through the center and a center of the protruder; a second surface bent from the edge of the first surface; a flange to connect the second surface and the protruder with each other; and at least one support that protrudes from the flange in a direction substantially parallel to the optical axis. An angle between a plane surface including a top surface of the flange and the second surface above the plane surface may be an acute angle.

Embodiments disclosed herein provide a light emitting device that may include a substrate; a plurality of light sources arranged on the substrate; and a plurality of optical lenses arranged on the plurality of light sources. The optical lens may include a protruder having a curved surface; a first surface having a center sunken toward the protruder and an edge connected with the center with a curved line, the first surface being spaced apart from the protruder in a direction of an optical axis, which is a virtual straight line that passes through the center and a center of the protruder; a second surface bent from the edge of the first surface; a flange to connect the second surface and the protruder with each other; and at least one support that protrudes from the flange in a direction parallel to the optical axis. An angle between a plane surface including a top surface of the flange and the second surface above the plane surface may be an acute angle.

Embodiments disclosed herein provide a display device that may include a backlight unit or backlight having a substrate; a plurality of light sources arranged on the substrate; and a plurality of optical lens arranged on the plurality of light sources; a liquid crystal panel arranged on the backlight unit; and a driving circuit part or drive circuit electrically connected to the liquid crystal panel. The optical lens may include a protruder having a curved surface; a first surface having a center sunken toward the protruder and an edge connected with the center with a curved line, the first surface being spaced apart from the protruder in a direction of an optical axis, which is a virtual straight line that passes through the center and a center of the protruder; a second surface bent from the edge of the first surface; a flange to connect the second surface and the protruder with each other; and at least one support that protrudes from the flange in a direction parallel to the optical axis. An angle between a plane surface including a top surface of the flange and the second surface above the plane surface may be an acute angle.

The optical lens according to the embodiments may secure uniformity of brightness without regard to sizes of the optical lens and a size of a gap between the optical lens and the light source.

While embodiments have been described with reference to the particular illustrative embodiments, it is to be appreciated that those skilled in the art may change or modify the embodiments without departing from the scope and spirit as defined in the following claims.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An optical lens, comprising:
a flange comprising an upper surface and a bottom surface;
a protruder that downwardly protrudes with respect to the bottom surface;
a first surface that extends from the upper surface of the flange; and
a second surface inwardly recessed toward the protruder, wherein the first surface and the second surface meet to form an outer rim of the optical lens, wherein the first surface is sloped with respect to an optical axis, which is a straight line that passes through a center of the protruder and a center of the second surface, and wherein a ratio of a longest straight-line distance between outermost edges of the flange taken across the flange to a shortest straight-line distance from a lowermost point of the protruder to a plane including the outer rim is approximately 0.5 to 5.

2. The optical lens according to claim 1, further comprising:
at least one support that protrudes from the bottom surface of the flange or an incident surface of the protruder.

3. The optical lens according to claim 2, wherein the at least one support protrudes in a direction substantially parallel to the optical axis.

4. The optical lens according to claim 2, wherein the at least one support is disposed adjacent to a circumferential edge of the bottom surface of the flange.

5. The optical lens according to claim 2, wherein the at least one support is disposed along a circumferential direction of the bottom surface of the flange.

6. The optical lens according to claim 1, wherein the first surface is curved.

7. The optical lens according to claim 1, wherein the first surface is sloped toward the optical axis as the first surface extends away from the flange.

8. The optical lens according to claim 1, wherein an angle formed between the first surface and an extended surface that extends from the upper surface of the flange toward the optical axis, and/or an angle formed by the first surface and the second surface are acute angles.

9. The optical lens according to claim 1, wherein a curved surface that connects the center of the second surface and the upper rim of the optical lens with each other satisfies the following equation:

$$B(u) = \sum_{k=0}^{N} P_k \frac{N!}{k!(N-k)!} u^k (1-u)^{N-k},$$ [Formula 1]

wherein B(u) is a continuous function obtained by the N control points which are located at different positions, N is a variable to determine the degree of Bezier curve function, $P_k$ means a coordinate of the $k^{th}$ control point, and u is a curved line section that the control points are subdivided in the range of 0 to 1.

10. The optical lens according to claim 1, wherein the protruder is symmetrical with respect to the optical axis.

11. The optical lens according to claim 1, wherein the protruder is inwardly recessed by a predetermined amount at the optical axis.

12. The optical lens according to claim 1, wherein a central axis of the protruder and a central axis of the second surface are located on the optical axis.

13. The optical lens according to claim 1, wherein the second surface is convex with respect to straight lines that pass through the center of the second surface and the outer rim of the optical lens.

14. The optical lens according to claim 1, wherein the flange connects the first surface and an incident surface of the protruder with each other.

15. A light emitting device, comprising:
a substrate;
a plurality of light sources arranged on the substrate; and
a plurality of optical lenses disposed adjacent to the plurality of light sources, wherein each of the plurality of optical lenses comprises:
a flange comprising an upper surface and a bottom surface;
a protruder that downwardly protrudes with respect to the bottom surface;
a first surface that extends from the upper surface of the flange; and
a second surface inwardly recessed toward the protruder, wherein the first surface and the second surface meet to form an outer rim of the optical lens, wherein the first surface is sloped with respect to an optical axis, which is a straight line that passes through a center of the protruder and a center of the second surface, and wherein a ratio of a longest straight-line distance between outermost edges of the flange taken across the flange to a shortest straight-line distance from a lowermost point of the protruder to a plane including the outer rim is approximately 0.5 to 5.

16. The light emitting device according to claim 15, wherein each optical lens has an incident surface spaced apart from a respective light source of the plurality of light sources.

17. The light emitting device according to claim 16, wherein the flange connects the first surface and an incident surface of the protruder with each other.

18. The light emitting device according to claim 16, further comprising:
at least one support that protrudes from the bottom surface of the flange or an incident surface of the protruder.

19. The light emitting device according to claim 18, wherein the at least one support protrudes in a direction substantially parallel to the optical axis.

20. The light emitting device according to claim 18, wherein the at least one support is disposed adjacent to a circumferential edge of the bottom surface of the flange.

21. The light emitting device according to claim 18, wherein the optical lens is separated from the respective light source of the plurality of light sources by the at least one support.

22. The light emitting device according to claim 15, wherein a first portion of light incident on the protruder is reflected by the first surface and is incident to the second surface, and a second portion of light incident on the protruder is reflected by the second surface and is incident to the first surface.

23. The light emitting device according to claim 22, wherein the first portion exits after being refracted by the second surface, and the second portion exits after being refracted by the first surface.

24. The light emitting device according to claim 22, wherein the first portion and the second portion exit from the optical lens in laterally opposite directions to each other based on the optical axis.

25. The light emitting device according to claim 22, wherein when it is defined that a clockwise direction becomes a positive (+) angle based on the optical axis and a counterclockwise direction becomes a negative (−) angle based on the optical axis, the first portion and the second portion progress at a progress angle within a range of approximately ±60 degrees after passing through the protruder.

26. The light emitting device according to claim 25, wherein the first portion and the second portion are incident to an incident surface of the protruder at an incident angle of approximately ±85 degrees based on the optical axis.

27. The light emitting device according to claim 22, wherein when it is defined that a clockwise direction becomes a positive (+) angle based on the optical axis and a counter-clockwise direction becomes a negative (−) angle based on the optical axis, the second portion satisfies exit angle/incident angle<0 relative to the optical lens.

28. The light emitting device according to claim 27, wherein the first portion satisfies exit angle/incident angle>0 relative to the optical lens.

29. A display, comprising:
a light emitting device, comprising:
   a substrate;
   a plurality of light sources arranged on the substrate; and
   a plurality of optical lenses disposed adjacent to the plurality of light sources;
one or more optical sheets disposed adjacent to the light emitting device; and
a liquid crystal panel disposed adjacent to the one or more optical sheets, wherein each of the plurality of optical lenses comprises:
   a flange comprising an upper surface and a bottom surface;
   a protruder that downwardly protrudes with respect to the bottom surface;
   a first surface that extends from the upper surface of the flange; and
   a second surface inwardly recessed toward the protruder, wherein the first surface and the second surface meet to form an outer rim of the optical lens, wherein the first surface is sloped with respect to an optical axis, which is a straight line that passes through a center of the protruder and a center of the second surface, and wherein a ratio of a longest straight-line distance between outermost edges of the flange taken across the flange to a shortest straight-line distance from a lowermost point of the protruder to a plane including the outer rim is approximately 0.5 to 5.

30. The display according to claim 29, wherein the one or more optical sheets comprises a plurality of optical films including a diffusion film.

* * * * *